United States Patent [19]

Toffolo

[11] Patent Number: 4,648,126
[45] Date of Patent: Mar. 3, 1987

[54] NOISE DETECTOR

[75] Inventor: Franco Toffolo, Eindhoven, Netherlands

[73] Assignee: U.S. Philips Corporation, New York, N.Y.

[21] Appl. No.: 747,522

[22] Filed: Jun. 21, 1985

[30] Foreign Application Priority Data

Jul. 23, 1984 [NL] Netherlands ............ 8402321

[51] Int. Cl.$^4$ .............................................. H04B 1/10
[52] U.S. Cl. ................................... 455/212; 455/222;
455/225; 455/303
[58] Field of Search ............... 455/218, 222, 223, 224,
455/225, 212, 213, 305, 303, 306, 311, 312;
307/358; 381/94; 375/102, 104

[56] References Cited

U.S. PATENT DOCUMENTS 4,039,959 8/1977 Pattantyus .................... 375/104
4,371,981 2/1983 King et al. ..................... 455/222
4,479,252 10/1984 Souchay et al. ............... 455/223

FOREIGN PATENT DOCUMENTS 0089134 7/1981 Japan ........................... 455/212

Primary Examiner—Jin F. Ng
Attorney, Agent, or Firm—Thomas A. Briody; William J. Streeter; Marianne R. Rich

[57] ABSTRACT

Noise detector for detecting noise pulses in a non-limited radio broadcast signal modulated on a carrier, comprising an amplitude detection circuit and coupled thereto a first signal comparison circuit having a signal input and a threshold input, a first threshold signal depending on the average input level of the noise detector and a second threshold signal depending on the noise pulse repetition frequency being applied to this threshold input. To limit the repetition frequency of the detection output signals of the noise detector without reducing the input sensitivity, the threshold level of the noise detector is controlled in forward direction in dependence on the field strength and the noise pulse repetition frequency. To that end the amplitude detection circuit is connected through a signal input to an input of the noise detector and through an envelope output to the signal input of the first signal comparison circuit and also to a signal input of a second signal comparison circuit, this envelope output also being coupled to a first low-pass filter for forming the first threshold signal, which first threshold signal is applied to the threshold input of the first signal comparison circuit and a threshold input of the second circuit, this second circuit being coupled through a second low-pass filter for forming the second threshold signal to the threshold input of the first circuit.

11 Claims, 3 Drawing Figures

NOISE DETECTOR

BACKGROUND OF THE INVENTION

The invention relates to a noise detector for detecting noise pulses in a non-limited incoming radio signal modulated on a carrier, comprising an amplitude detection circuit and, coupled thereto, a first signal comparison circuit having a signal input and a threshold input, a first threshold signal which depends on the average input level of the noise detector and a second threshold signal which depends on the noise pulse repetition frequency being applied to this threshold input.

Such a noise detector is disclosed in the United Kingdom Patent Specification No. 2,113,047.

In the Patent Specification the noise detector is described for use in a radio receiver whose RF-input signal is applied to the signal input of the first signal comparison circuit through an RF-amplifier. The level of the input signal at which noise detection is effected—called the threshold value hereinafter—is determined with the prior art noise detector by the sum of the first and second threshold signals. The first threshold signal is obtained by amplitude detection and a certain amount of integration of the IF-signal. As the average IF-signal varies with the average RF-input level, for example the field strength of the incoming signal, a field strength—dependent noise detection is thus obtained.

The second threshold signal is obtained by measuring the repetition frequency of the detection signals at the output of the first signal comparison circuit, the noise detection also depending on the repetition frequency of the amplitude disturbances in the input signal of the noise detector via this second threshold signal.

The derivation of the second threshold signal from the output signal of the first signal comparison circuit introduces however a control error which is necessary to preserve the control. An increase of the noise pulse repetition frequency at the input of this first circuit causes the second threshold signal to increase only when the repetition frequency of the detection signals at the output has increased. A high value of the second threshold signal, which is desired in the event of a high noise pulse repetition frequency, can however only be obtained if the repetition frequency of the detection signals is also high. In the case in which these detection signals are used as control signals for cancelling noise by means of signal suppression this may result in a fast and consequently annoying sequence of interruptions in the sound reproduction. This effect can be reduced by selecting the dependency of the total threshold level on the first threshold signal to be large compared with the second threshold signal. However, this also reduces the initial input sensitivity of the noise detector, that is to say the input sensitivity in a somewhat longer absence of noise pulses.

SUMMARY OF THE INVENTION

The invention has for its object to provide a field strength-dependent noise detector which has a high initial input sensitivity, and produces detection signals whose repetition frequency does not exceed a given, adjustable maximum value.

Such a noise detector according to the present invention comprises the amplitude detection circuit connected to an input of the noise detector by a signal input and also by an envelope output to the signal input of the first signal comparison circuit and to a signal input of a second signal comparison circuit This envelope output is also coupled to a first low-pass filter for forming the first threshold signal, which is applied to the threshold input of the first circuit and to a threshold input of the second circuit. This second circuit is also coupled through a second low-pass filter to the threshold input of the first circuit to form the second threshold signal.

When the measure according to the invention is applied noise pulses in the envelope correspond to noise pulses in the input signal of the noise detector and the second threshold signal is derived from the noise pulses of this input signal by means of a field strength-dependent noise pulse selection in the second signal comparison circuit and integration in the second low-pass filter. Together with the first threshold signal the second threshold signal is applied to the threshold input of the first signal comparison circuit so that, in dependence on both the field strength and the noise pulse repetition frequency a forward control of the threshold level is effected. By adequately dimensioning the second low-pass filter and/or an adequate amplification of its output signal the second threshold signal increases to a sufficiently high extent with the repetition frequency of the input disturbances and the threshold level can be adapted without control error to both the field strength and the noise repetition frequency also in the event of a high initial input sensitivity, that is to say at a lowest value of the first threshold signal which is chosen to be relatively small.

To adapt the noise selection in a simple way to human hearing and to render it at the same time insensitive to the extent of the dynamic range of the input signals of the noise detector, a preferred embodiment of the noise detector according to the present invention includes a logarithmic converter circuit whose output signal varies proportionally with the logarithm of its input signal. This converter is arranged in cascade with the amplitude detection circuit and forms therewith a logarithmic level detection circuit for producing the envelope of the logarithm of the input signal of the noise detector at the envelope output.

In this embodiment the threshold level of the noise detector is determined by the product of the first and second threshold signals and it has been found that the noise selection criterion thus obtained varies in practice versus the audibility of the disturbances in the useful signal. The logarithmic converter circuit also results in dynamic compression so that the noise selection criterion can be achieved independently of the dynamic input range by simple circuits, which need only to be linear within a relatively small amplitude variation range.

In another preferred embodiment of a noise detector according to the present invention a fixed threshold value is also applied to the threshold inputs of the two signal comparison circuit for shifting the threshold level of both circuit over a fixed value, the fixed threshold value being applied to the threshold input of the second signal comparison circuit exceeding the average noise level in the signal applied to the signal input of the second signal comparison circuit.

In this embodiment use is made of the fact that amplitude disturbances in the input signal of the noise detector and consequently in the signal at the envelope output can be distinguished as noise peaks caused by atmospheric and/or thermal noise and generally having a small amplitude relative to the field strength and occurring with a high repetition frequency; field strength disturbances caused by given receiving conditions such as, for example, multipath reception resulting in larger amplitude disturbances having a frequency of the order of 20 kHz, and in noise pulses which are produced by artificial noise sources such as, for example, the ignition in internal combustion engines and generally have a very high amplitude relative to the field strength and occur at a comparatively low repetition frequency.

In the last-mentioned embodiment, the second threshold signal follows the repetition frequency of these noise pulses rapidly and accurately without being affected by the other amplitude disturbances. The threshold level of the second signal comparison circuit can be positioned just above the average level of the noise peaks by by selecting a small, fixed threshold value, so that these noise peaks do not or substantially not affect the input signal of this circuit. The input sensitivity of this second signal comparison circuit is hardly affected thereby. However, the field strength disturbances of a larger amplitude are transmitted substantially without a delay by the first low-pass filter and occur substantially simultaneously and with the same amplitude at both the threshold input and the signal input of the second signal comparison circuit, so that detection of these field strength variations is prevented.

However, because of their specific pulse shape and the lower repetition frequency, these noise pulses are submitted to an adequate delay in the first low-pass filter so that the threshold at the input of the second signal comparison circuit is exceeded, which results in an output (pulse) signal from which the second threshold signal is derived.

In a similar way the first signal comparison circuit is insensitive to noise peaks and field strength disturbances and has an adequate variation of the threshold level in dependence on the noise pulse repetition frequency in a further preferred embodiment where the fixed threshold value applied to the threshold input of the first signal comparison circuit is equal to the fixed threshold value of the second signal comparison circuit, the second low-pass filter having a 3 dB-cut off frequency of the order of magnitude of 0.1 kHz.

A further preferred embodiment of a present invention noise detector includes a monostable multi-vibrator (one shot) which is arranged between the second signal comparison circuit and the second low-pass filter and, where between the second low-pass filter and the threshold input of the first signal comparison circuit a threshold circuit is arranged for delaying an increase of the second threshold signal until the noise pulse repetition frequency has increased to the order of 5 kHz.

When this measure is applied, noise peaks whose values exceed the average value and may exceed the fixed threshold value are prevented from giving rise to an undesired increase in the repetition frequency of the detection output signals of the noise detector, without a reduction in the sensitivity of the second signal comparison circuit.

Another, further preferred embodiment is characterized in that the second signal comparison circuit is coupled to a differential amplifier for a substantially linear amplification of the amplitude value, over which the signal at the signal input exceeds the signal at the threshold input of this second circuit.

The invention will now be described in greater detail by way of example with reference to the figures shown in the accompanying drawing wherein:

DESCRIPTION OF THE PREFERRED EMBODIMENTS

Figure 1:
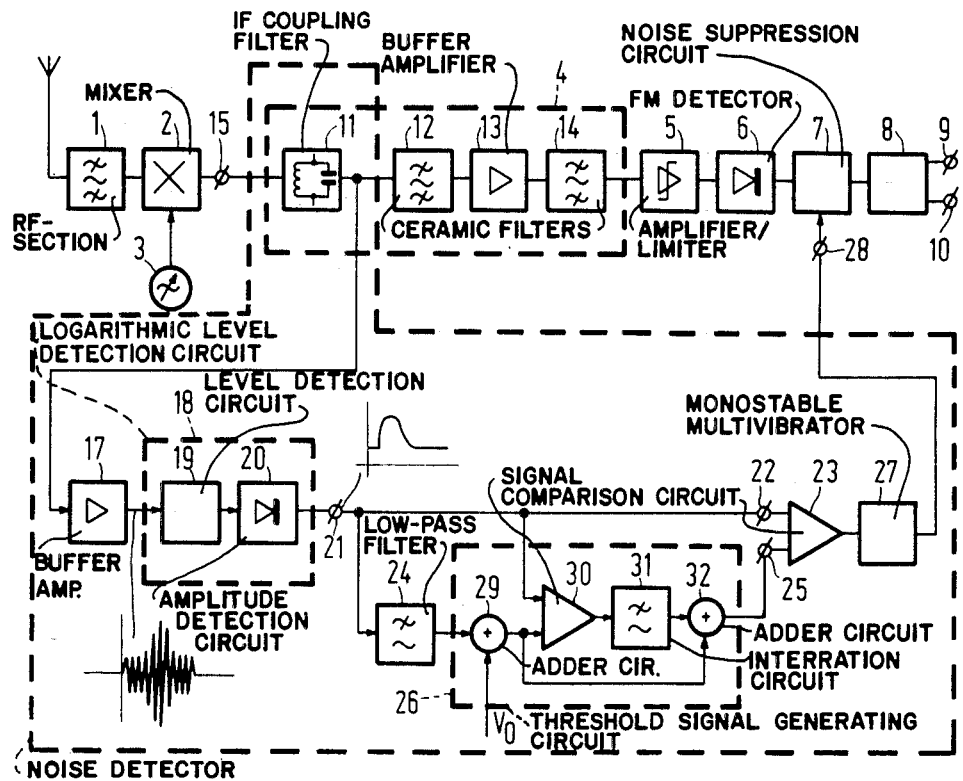
FIG. 1 shows an FM-radio receiver comprising a noise detector according to the present invention.

FIG. 1 shows the FM-section of a prior art car radio of the Philips type 22AC 820. This car radio comprises, coupled one after the other to an aerial input, an RF-section 1, a mixer stage 2 to which oscillator mixer signals are applied from a tuning oscillator 3, an IF-portion 4, a limiter/amplifier 5, an FM-detector 6, a noise suppression circuit 7, a stereo-decoder/audio-processing portion 8 and stereophonic left and right audio outputs 9 and 10.

From the incoming RF-radio signal a desired RF-FM signal is selected in the RF-section 1 and applied to the mixer stage 2, in which frequency conversion is effected into an FM-intermediate frequency of 10.7 MHz. IF-selection and amplification are effected in the IF-portion 4. This IF-portion 4 comprises a cascade arrangement of, in succession, an IF-coupling filter 11, a first ceramic filter 12, a buffer amplifier 13 and a second ceramic filter 14. The IF-coupling filter 11 is used predominantly for coupling the mixer stage 2 output signal and at the same time for realizing a certain degree of selectivity. In addition, the IF-coupling filter 11 forms part of a noise detector 16 still further to be described hereinafter. The actual IF-selectivity is realized by means of the ceramic filters 12 and 14.

After an optionally further amplification and limitation in the amplifier/limiter 5, FM-detection in the FM-detector 6 is effected and the FM-modulation signal or, in the event of a stereophonic broadcast the stereo multiplex signal is made free from interference in the noise suppression circuit 7. To that end this noise suppression circuit 7 may be realized with the aid of an integrated circuit of the type TDA 1001 and comprises an hold circuit (not shown) in which in a manner known per se the signal level is kept constant during a certain period of time at the occurrence of a detection signal at a trigger input 28. Thereafter dematrixing of the stereo multiplex signal and further audio signal processing is effected and the desired stereophonic audio signals are available at the outputs 9 and 10.

The receiver described so far is known from, for example, the manual of the car radio and a further explanation of the signal processing operation and the manner in which noise is suppressed is not necessary for an understanding of the invention.

The noise detector 16 according to the invention has an input 15, which is coupled to the output of the mixer stage 2 and at which the desired and non-limited IF-signal, FM-modulated on the 10.7 MHz intermediate frequency carrier, is available. After having been decoupled by the IF-coupling filter 11, this FM-modulated incoming radio signal is amplified in a buffer amplifier 17 and applied to a logarithmic level detection circuit 18. This level detection circuit 18 forms in a known manner the logarithm of the envelope of the incoming radio signal and for that purpose comprises a cascade arrangement of a logarithmic converter circuit 19, whose output signal varies proportionally to the logarithm of its input signal, and an amplitude detection circuit 20, which produces the envelope of this output signal at an envelope output 21. The logarithmic level detection circuit 18 can be obtained with an integrated circuit of the type TDA 1576. For a more deteailed description of the signal processing operation performed therein reference is made to the manual of this integrated circuit, as published in, for example, "Philips Datahandbook" ICI 01-83-"Integrated Circuits", Part 1, January 1983.

The envelope output 21 is coupled to a first signal comparison circuit 23 by a signal input 22 and also by a first low-pass filter 24 and a threshold signal generating device 26, still further to be described, to a threshold input 25 of the first signal comparison circuit 23. The first low-pass filter 24 has a cut-off frequency which, on one hand is adequately low to provide in its output signal a reliable measure of the average value of the envelope at the envelope output 21 and thus produces the first threshold signal which varies with the average field strength. On the other hand the cut-off frequency of the first low-pass filter 24 has been chosen sufficiently high to allow amplitude distortions caused by certain receiving conditions, such as, for example, field strength fluctuations, multipath reception, fading etc. to pass without any delay. In practice it has been found that a cutoff frequency of the order of magnitude of 100 kHz gives the desired results.

The threshold signal generating device 26 arranged between the first low-pass filter 24 and the threshold input 25 comprises a first adder circuit 29 in which a fixed threshold value $V_o$ is added to the output signal of the low-pass filter 24. The resultant sum signal is applied to a threshold input of a second signal comparison circuit 30 and determines the threshold level of this circuit. The circuit 30 is also coupled by a signal input to the envelope output 21 and produces an output signal when the envelope exceeds the threshold level. The threshold level is chosen such that not only, comparatively large, noise pulses in the envelope, caused by artificial interferences (man-made noise), such as, for example, engine ignition pulses, but also the amplitude distortions due to receiving conditions which are much smaller compared with these pulses, exceed this threshold level and that only very small disturbances caused by, for example, noise remain below this threshold level. For that purpose the fixed threshold value $V_o$ is chosen to be very small. In practice it has been found that suitable values of $V_o$ at the input of the logarithmic level detection circuit 18 correspond to a ratio factor of the order of magnitude of 1 dB. For each time that the threshold level is exceeded the output signal of the second signal comparison circuit 30 may have a fixed pulse shape but it may alternatively vary proportionally to the difference between the envelope and the threshold level, which will be described in greater detail hereinafter.

Integration of this output signal is effected in an integration circuit 31 which is coupled to the output of the circuit 30. This integration circuit produces the second threshold signal, which depends on the repetition frequency of the amplitude disturbances in the incoming non-limited FM-IF radio signal applied to the noise detector 16.

The integration circuit 31 is coupled to the threshold input 25 of the first signal comparison circuit 23 by a second adder circuit 32. In this second adder circuit 32 the second threshold signal is added to the sum of the first threshold signal and the fixed threshold value $V_o$. To that end an output of the first adder circuit 29 is coupled to an input of the second adder circuit 23. Consequently, the threshold level of the first signal comparison circuit 23 is obtained in the forward direction and is determined by the sum of two threshold signals and the comparatively small fixed threshold value $V_o$. If the envelope at the signal input 22 exceeds this threshold level, then the first signal comparison circuit 23 applies a detection signal to a monostable multi-vibrator 27 which is triggered thereby and applies a trigger signal to the trigger input 28 of the noise suppression circuit 7, which in its turn suppresses the noise pulse.

The threshold level may be exceeded when the instantaneous amplitude of the incoming non-limited 10.7 MHz FM IF radio signal at the input 15 of the noise detector 16 exceeds a value in respone to a noise pulse, this value corresponding to the product of the inversely logarithmic transformed values of the two threshold signals and the fixed threshold value $V_o$ at the input of the logarithmic converter circuit 19. Variations in this product are predominantly determined by variations in the two threshold signals. With a correct variation of these threshold signals in dependence on the average field strength and respectively the noise repetition frequency, a noise selection criterion is achieved which is adapted to the human ear resulting in minimum noise impression. In addition, the logarithmic conversion affects a significant compression of the dynamic range of the input signal, so that an unambiguous noise selection can be achieved with simple circuits.

Figure 2:
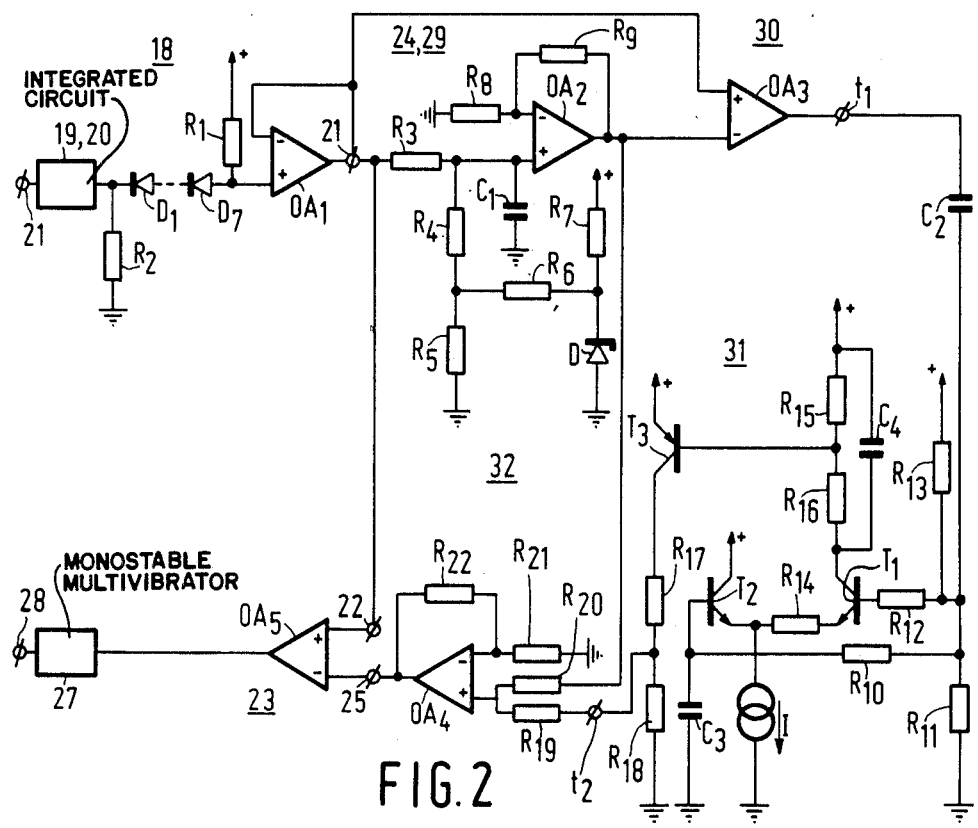
FIG. 2 shows one embodiment of a noise detector according to the invention.

FIG. 2 shows an embodiment of the noise detector 16 according to the present invention, whose circuits which have the same functions as those shown in the preceding Figure are referenced correspondingly.

Therein the logarithmic level detection circuit 18 comprises an integrated circuit 19, 20 of the type TDA 1576, an output of which is coupled in the manner shown to the envelope output 21 through a biasing circuit $R_1$, $D_1$–$D_7$, $R_2$ and a buffer stage OA1. The biasing circuit $R_1$, $D_1$–$D_7$, $R_2$ and the buffer stage OA1 predominantly serve to set the working point and for impedance matching.

The beforementioned first low-pass filter 24 coupled to the envelope output 21, the first adder circuit 29 and the generating of the fixed threshold value $V_o$ is realized with the aid of the circuit 24, 29. This circuit 24, 29 comprises a resistance network $R_3$–$R_7$, of which three resistors $R_3$–$R_5$ are arranged in series between the envelope output 21 and ground. The junction of the resistors $R_3$ and $R_4$ is AC-coupled to ground through a smoothing capacitor $C_1$, and also to a non-inverting input of an operational amplifier OA2. The junction between the resistors $R_4$ and $R_5$ is connected via a resistor $R_6$ to the junction between a resistor $R_7$ and a zener diode D, this resistor $R_7$ and this zener diode D being arranged in series between a supply voltage and ground. The resistors $R_3$–$R_7$ are chosen such that on one hand a desired portion (30 mV) of the fixed voltage across the zener diode D is added as a fixed threshold voltage $V_o$ to the signal applied to the non-inverting input of OA2. On the other hand, the resistors $R_3$–$R_7$ and the differential resistance of the zener diode D form together with the smoothing capacitor $C_1$ an RC-low-pass filter whose cut-off frequency is of the order of 100 kHz. The operational amplifier OA2 is negatively fedback by means of a negative feedback resistor $R_9$, which is arranged between an output and an inverting input, this inverting input being connected to ground through a resistor $R_8$. With the aid of these resistors $R_8$ and $R_9$ the gain of the operational amplifier $OA_2$ is adjusted such that it compensates for the signal losses in the resistance network $R_3-R_7$.

The second signal comparison circuit 30 is obtained by means of an operational differential amplifier $OA_3$, a non-inverting input of which functions as a signal input to which the envelope signal from the envelope output 21 is applied and an inverting input of which functions as a threshold input to which the output signal of the operational amplifier $OA_2$ for example first threshold signal is applied. Since the amplitudes of the signals at the two inputs of the operational amplifier $OA_3$ only differ considerably at the occurrence of a noise pulse and differ only by the low fixed threshold value $V_o$ in the absence of noise pulses, the output pulse signals of this operational amplifier $OA_3$ correspond the noise pulses in the envelope signal.

The second low-pass filter 31 at the output terminal $t_1$ of the second signal comparison circuit 30 is realized by means of a parallel RC-low-pass filter $R_{15}$, $R_{16}$, $C_4$ included in the collector of a transistor $T_1$. An emitter-coupled transistor $T_2$ whose base is AC-connected to ground through a capacitor $C_3$, forms together with the transistor $T_1$ a differential amplifier $T_1$, $T_2$. From the output terminal $t_1$ noise pulses are applied to this differential amplifier $T_1$, $T_2$ through a coupling capacitor $C_2$. The transistors $T_1$ and $T_2$ are biased to a mutually equal base voltage by base biasing resistors $R_{10}-R_{13}$. However, a resistor $R_{14}$ is arranged between the emitters of $T_1$ and $T_2$, the junction point between the emitter of $T_2$ and the resistor $R_{14}$ being connected to a common emitter current source I. By an adequate choice of the resistor $R_{14}$, $T_1$ is just current-less when there is no interference and becomes conductive at the occurrence of a noise pulse. The pulsating collector current of $T_1$ due to noise pulses at its base are integrated in the capacitor $C_4$ of the parallel RC-low-pass filter $R_{15}$, $R_{16}$, $C_4$, so that a voltage is produced thereacross which is proportional to both the amplitude and the repetition frequency of the noise pulses.

A portion of this capacitor voltage which is obtained across a resistor part $R_{15}$ of the parallel resistor $R_{15}$, $R_{16}$ of the parallel RC-low-pass filter $R_{15}$, $R_{16}$, $C_4$ is applied to the base of a transistor $T_3$, which forms part of a threshold voltage circuit $T_3$, $R_{17}$, $R_{18}$. The transistor $T_3$ becomes conductive when the voltage across the resistor part $R_{15}$ exceeds the base-emitter voltage ($\approx 600$ mV). A portion of the collector current of the transistor $T_3$ is applied as a second threshold signal to the second adder circuit 32 through a voltage divider $R_{17}$, $R_{18}$ of the threshold voltage circuit $T_3$, $R_{17}$, $R_{18}$ and a terminal $t_2$. An increase in the collector current is delayed until the increase of the noise content has reached a value which corresponds to base-emitter voltage. Consequently the ultimate noise pulse detection is not or substantially not affected by amplitude disturbances in the signal other than noise pulses, which deviate so much from the average amplitude that they are capable of passing through the second signal comparison circuit 30.

The second adder circuit 32 is realized with the aid of an operational amplifier $OA_4$, which has a non-inverting input at which there are added on one hand the first threshold signal and the fixed threshold value $V_o$ applied from the output of the first adder circuit 29 through an input resistor $R_{20}$, and on the other hand the second threshold signal applied from the second low-pass filter 31 via, in succession, the transistor $T_3$, the terminal $t_2$ and an input resistor $R_{19}$. The operational amplifier $OA_4$ is negatively fedback through a negative feedback resistor $R_{22}$ arranged between an output and an inverting input, the inverting input being connected to ground through a resistor $R_{21}$. With the aid of these resistors $R_{21}$ and $R_{22}$ the gain of the operational amplifiers $OA_4$ is adjusted such that it compensates for the signal attenuation occurring at the summation of the two threshold signals. The output signal of the second adder circuit 32 determines the threshold level of the first signal comparison circuit 23. This signal comparison circuit is constituted by an operational amplifier $OA_5$, whose mode of operation corresponds to that of the operational amplifier $OA_3$. An inverting input thereof functions as the threshold input 25 and is coupled to the output of the operational amplifier $OA_4$. A non-inverting input functions as a signal input 25 and is coupled to the envelope output 21.

An output of the operational amplifier $OA_5$ is coupled to a monostable multivibrator 27 of the integrated circuit type HEF 4538 BP. In the embodiment shown, integrated circuits of the type NE 5535 N are used for the operational amplifiers $OA_1$, $OA_2$ and $OA_4$, and integrated circuits of the type LM 119 for the operational amplifiers $OA_3$ and $OA_5$. The diodes $D_1-D_7$ were of the type BAW 62, the zener diode of the type BZ x 75C2V8 and the respective resistors and capacitors had the following values:

Resistors ($\Omega$)

| $R_1$: 3,9 k | $R_6$: 2,2 k | $R_{11}$: 1,8 k | $R_{16}$: 2,2 k | $R_{21}$: 39 k |
| $R_2$: 300 k | $R_7$: 1 k | $R_{12}$: 10 k | $R_{17}$: 2,2 k | $R_{22}$: 7,3 k |
| $R_3$: 27 k | $R_8$: 27 k | $R_{13}$: 15 k | $R_{18}$: 5,6 k | |
| $R_4$: 110 k | $R_9$: 10 k | $R_{14}$: 560 | $R_{19}$: 100 k | |
| $R_5$: 220 | $R_{10}$: 10 k | $R_{15}$: 12 k | $R_{20}$: 27 k | |

Capacitors (Values in F)
$C_1$: 68 p
$C_2$: 100 n
$C_3$: 100 n
$C_4$: 100 n

Figure 3:
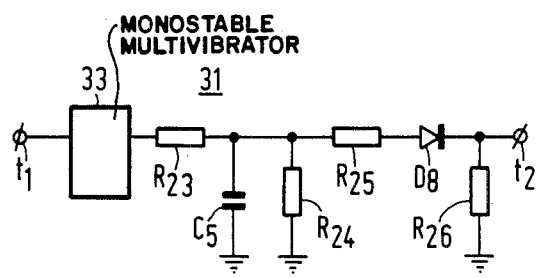
FIG. 3 shows another embodiment of a portion of the noise detector according to the invention.

FIG. 3 shows a different embodiment of the circuit portions between the terminals $t_1$ and $t_2$ of the circuit of the FIG. 2, by means of which a second threshold signal is obtained independent of the noise pulse amplitude. To that end the terminal $t_1$ is coupled to a monostable multivibrator 33, which converts each current pulse applied from the second signal comparison circuit 30 through the terminal $t_1$ into one and the same pulse shape. Integration of these noise pulses of identical shapes is effected in the second low-pass filter 31, which has a 3 dB-cut-off frequency of the order of magnitude of 0.1 kHz and comprises a series resistor $R_{23}$ coupled to the output of the monostable multivibrator 33 and a grounded parallel RC network $R_{24}$, $C_5$. A portion of the voltage across this parallel RC network is applied to the terminal $t_2$ through a voltage divider $R_{25}$, $D_8$, $R_{26}$. This voltage divider $R_{25}$, $D_8$, $R_{26}$ also functions as a threshold voltage circuit. In this embodiment the terminal $t_2$ is coupled to the junction point between a diode $D_8$ and a grounded resistor $R_{26}$ of this voltage divider $R_{25}$, $D_8$, $R_{26}$. The diode $D_8$ is used to delay the increase in voltage at the terminal $t_2$ when the pulse repetition frequency increases so as to reduce, also for this circuit, the influence of amplitude disturbances which are of such a high value that they pass the second signal comparison circuit 30 and trigger the monostable multivibrator 33, on the second threshold signal to a very large extent.

In a practical embodiment the diode $D_8$ was of the type BAX 14 and the components had the following values:

$R_{23}$: 56 kΩ $C_5$: 220 nF
$R_{24}$: 100 kΩ
$R_{25}$: 22 kΩ
$R_{26}$: 8,2 kΩ

What is claimed is:

1. A noise detector for selecting noise pulses from a non-limited FM radio broadcast signal modulated on a carrier comprising:
   a logarithmic level detection circuit having an input for receiving said modulated signal and an output for supplying the logarithm of the envelope of said modulated signal
   a first lowpass filter having an input connected to said output of said logarithmic level detection circuit and an ouput for producing a signal representing the average value of said envelope;
   a threshold generating circuit connected to said outputs of said logarithmic level detection circuit and said first lowpass filter which generates first and second threshold levels, said first threshold level being generated during a first signal condition when said lowpass filter output signal is less than said logarithmic detection circuit output signal, said second threshold level being generated during a second signal condition when said lowpass filter signal is greater than said logarithmic level detection output signal;
   a first signal comparison circuit having a signal input, and a threshold input and an output, said signal input being connected to said output of said logarithmic level detection circuit, said threshold input being connected to said output of said threshold generating circuit for receiving said first or second threshold level signals, said first signal comparison circuit supplying a detection signal when a signal amplitude value at said signal input exceeds the amplitude value of one of said threshold level signals.

2. A noise detector of claim 1 wherein said first threshold level is proportional to the summation of said first lowpass filter output signal and the integral of said lowpass filter output signal.

3. A noise detector of claim 1 wherein said second threshold level is proportional to said lowpass filter output signal.

4. A noise detector of claim 1 wherein said threshold generating circuit comprises:
   a second signal comparison circuit having a signal input, and a threshold input and an output, said signal input being connected to said output of said logarithmic level detection circuit, said threshold input being connected to said output of said first lowpass filter, said second signal comparison circuit supplying an output signal when a signal amplitude value at said signal input exceeds the amplitude value of said threshold level input;
   a second lowpass filter having an input connected to said output of said second signal comparison circuit and an output supplying an integrated signal; and
   an adder circuit having one input connected to said second lowpass filter for receiving said integrated signal and a second input connected to said output of said first lowpass filter said adder circuit adding said output signal of said first lowpass filter to said integrated signal, said adder circuit supplying an output signal representing said first threshold level.

5. A noise detector of claim 4 wherein said threshold generating circuit further comprises another adder circuit having one input connected to said output of said first lowpass filter and a second input for receiving a fixed threshold value, said another adder circuit adding said fixed threshold value to said output signal of said first lowpass filter, said fixed threshold value effecting a D.C. shift of said signal representing said average value at an output of said another adder circuit.

6. A noise detector as claimed in claim 5 wherein said fixed threshold value exceeds the average noise level in said signal applied to said signal input of said second signal comparison circuit.

7. A noise detector as claimed in claim 6, wherein said fixed threshold value is about 1 dB.

8. A noise detector as claimed in claim 7, wherein said second lowpass filter has a 3 dB-cut-off frequency of 0.1 kHz.

9. A noise detector as claimed in claim 4 further comprising a monostable multivibrator connected between said second signal comparison circuit and said second low-pass filter and a threshold circuit connected between said second low-pass filter and the threshold input of said first signal comparison circuit for delaying an increase of said threshold level signal until noise repetition frequency has increased to about 5 kHz.

10. A noise detector as claimed in claim 1 wherein said logarithmic level detection circuit comprises a logarithmic converter circuit having an output signal proportional to the logarithm of its input and an amplitude detection circuit having an input connected to said output of said logarithmic converter.

11. A noise detector for selecting noise pulses from a non-limited FM radio broadcast signal modulated on a carrier comprising:
   a logarithmic level detection circuit having an input for receiving said modulated signal and an output for supplying the logarithm of the envelope of said modulated signal
   a first lowpass filter having an input connected to said output of said logarithmic level detection circuit and an output for producing a signal representing the average value of said envelope;
   a first adder circuit having one input connected to said output of said first low pass filter and a second input for receiving a fixed threshold value, said adder circuit adding said fixed threshold value to said average value signal, said fixed threshold value effecting a D.C. shaft of said signal representing said average value at an output of said adder circuit;
   a signal comparison circuit having a signal input, and a first threshold input and an output, said signal input being connected to said output of said logarithmic level detection circuit, said first threshold input being connected to said output of said first adder circuit for receiving a first threshold level signal, said signal comparison circuit supplying an output signal when a signal amplitude value at said signal input exceeds amplitude value of said threshold level signal;

a second lowpass filter having an input connected to said output of said signal comparison circuit and an output supplying an integrated output signal;

a second adder circuit having one input connected to said second lowpass filter for receiving said integrated signal and a second input connected to said output of said first adder circuit for receiving a signal representing said first threshold level signal, said second adder circuit adding said first threshold level signal to said integrated signal, said second adder circuit supplying an output signal representing a second threshold level, said second threshold signal depending on a noise pulse repetition frequency; and another signal comparison circuit having a signal input, and a second threshold input and an output, said signal input being connected to said output of said logarithmic level detection circuit, said second threshold input being connected to said output of said second adder circuit for receiving said second threshold level signal, said another signal comparison circuit supplying a detection signal when a signal amplitude value at said signal input exceeds the amplitude value of said second threshold level signal.

* * * * *